United States Patent
Shinohara

(10) Patent No.: US 7,848,104 B2
(45) Date of Patent: Dec. 7, 2010

(54) POWER MODULE

(75) Inventor: Toshiaki Shinohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/512,439

(22) Filed: Jul. 30, 2009

(65) Prior Publication Data

US 2010/0238627 A1 Sep. 23, 2010

(30) Foreign Application Priority Data

Mar. 23, 2009 (JP) ............................. 2009-069392

(51) Int. Cl.
*H05K 7/20* (2006.01)
(52) U.S. Cl. .................. 361/695; 361/704; 361/707; 361/715; 361/717; 361/719; 257/712; 165/80.3
(58) Field of Classification Search ............... None
See application file for complete search history.

(56) References Cited

U.S. PATENT DOCUMENTS

| | | | | |
|---|---|---|---|---|
| 6,232,151 B1 * | 5/2001 | Ozmat et al. | ............... | 438/122 |
| 6,297,549 B1 * | 10/2001 | Hiyoshi | ............... | 257/703 |
| 6,377,461 B1 * | 4/2002 | Ozmat et al. | ............... | 361/704 |
| 6,465,728 B1 * | 10/2002 | McLaughlin et al. | ....... | 174/16.3 |
| 7,106,592 B2 * | 9/2006 | Inoue et al. | ............... | 361/704 |
| 7,242,582 B2 * | 7/2007 | Kurauchi et al. | ............ | 361/704 |
| 7,547,966 B2 * | 6/2009 | Funakoshi et al. | .......... | 257/707 |
| 7,608,917 B2 * | 10/2009 | Kajiwara et al. | ............ | 257/678 |
| 2009/0116197 A1 * | 5/2009 | Funakoshi et al. | .......... | 361/719 |

FOREIGN PATENT DOCUMENTS

| | | |
|---|---|---|
| JP | 2001-230582 | 8/2001 |
| JP | 2005-303018 | 10/2005 |
| JP | 2007-281274 | 10/2007 |
| JP | 2008-124430 | 5/2008 |

\* cited by examiner

*Primary Examiner*—Boris L Chervinsky
(74) *Attorney, Agent, or Firm*—Oblon, Spivak, McClelland, Maier & Neustadt, L.L.P.

(57) ABSTRACT

A power module includes a power device having a top electrode and a bottom electrode, an upper metal block connected to the top electrode, a lower metal block connected to the bottom electrode, a resin covering the power device, the upper metal block and the lower metal block so as to expose a upper surface of the upper metal block and a lower surface of the lower metal block, an upper terminal-cooling power-applying block connected to the upper metal block, a lower terminal-cooling power-applying block connected to the lower metal block, an upper terminal connected to the upper terminal-cooling power-applying block, a lower terminal connected to the lower terminal-cooling power-applying block, and a insulating case covering all elements so as to expose a part of the upper terminal and a part of the lower terminal.

9 Claims, 5 Drawing Sheets

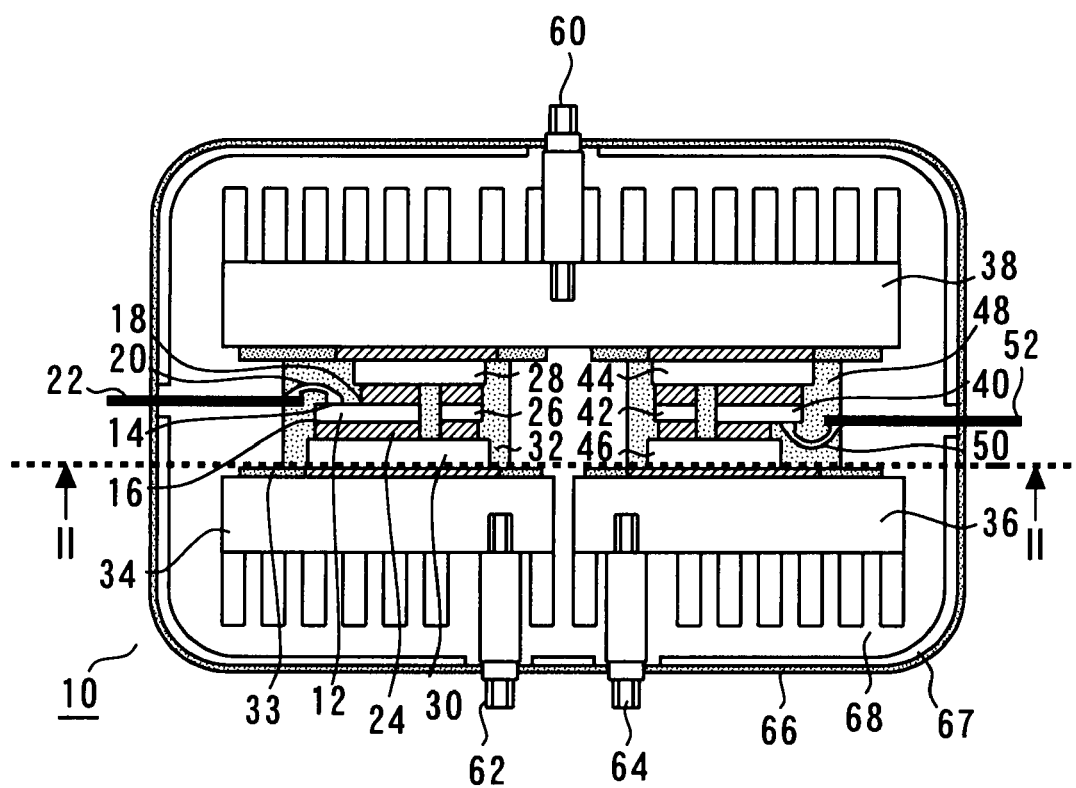
F I G. 1

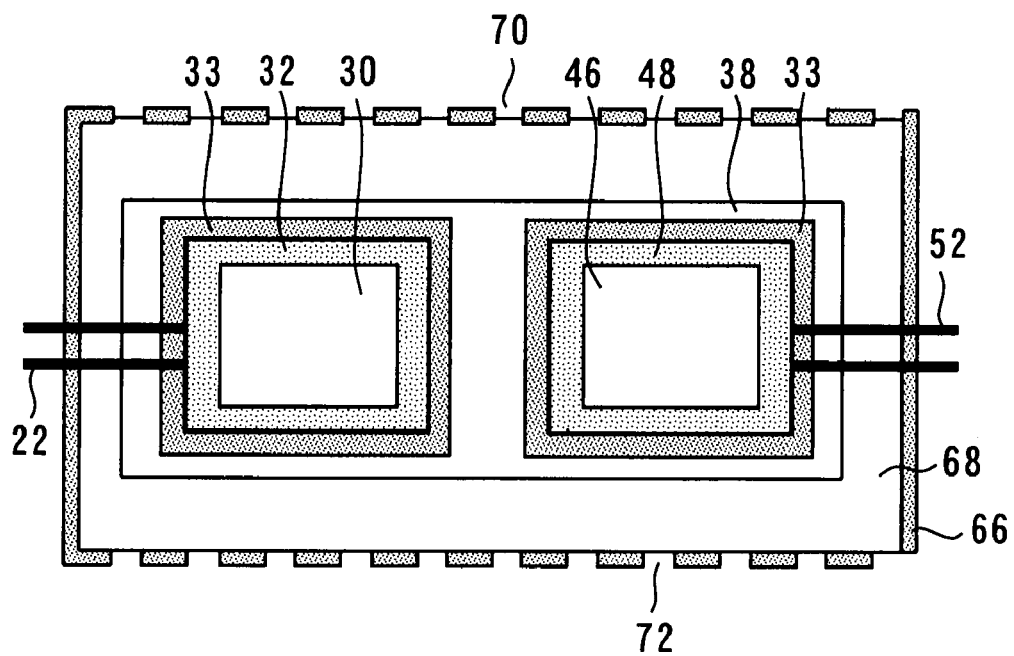
F I G. 2
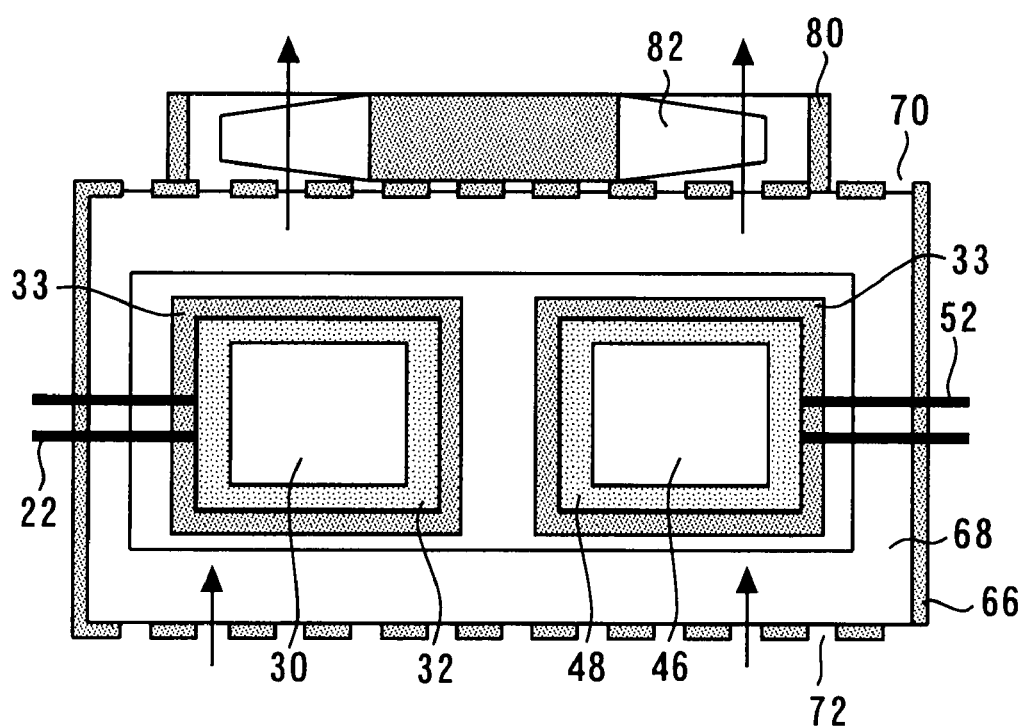
F I G. 3

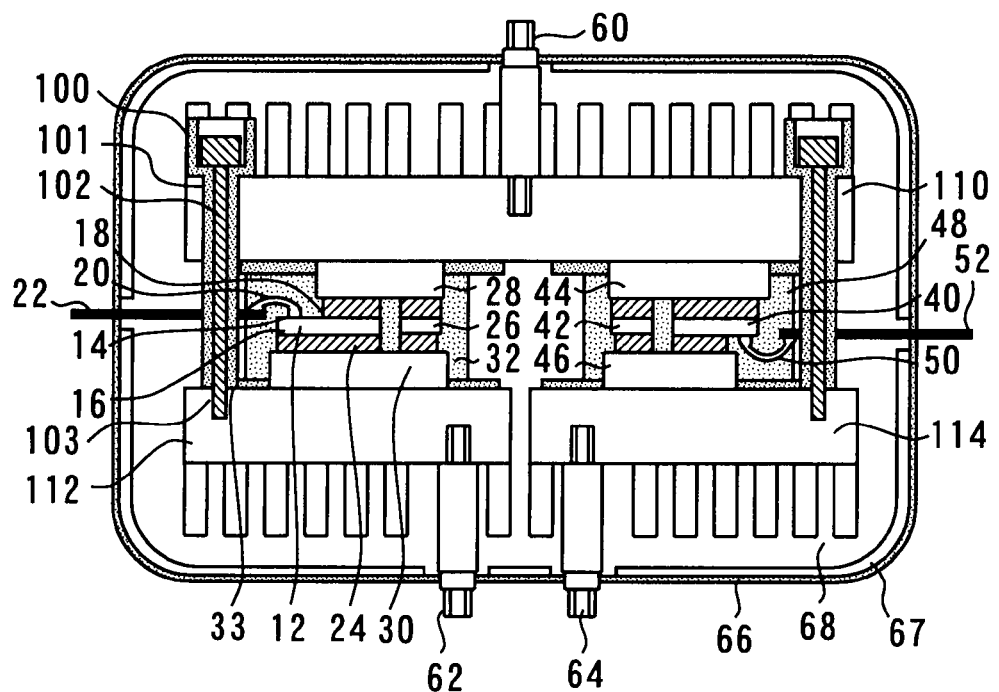
F I G. 4
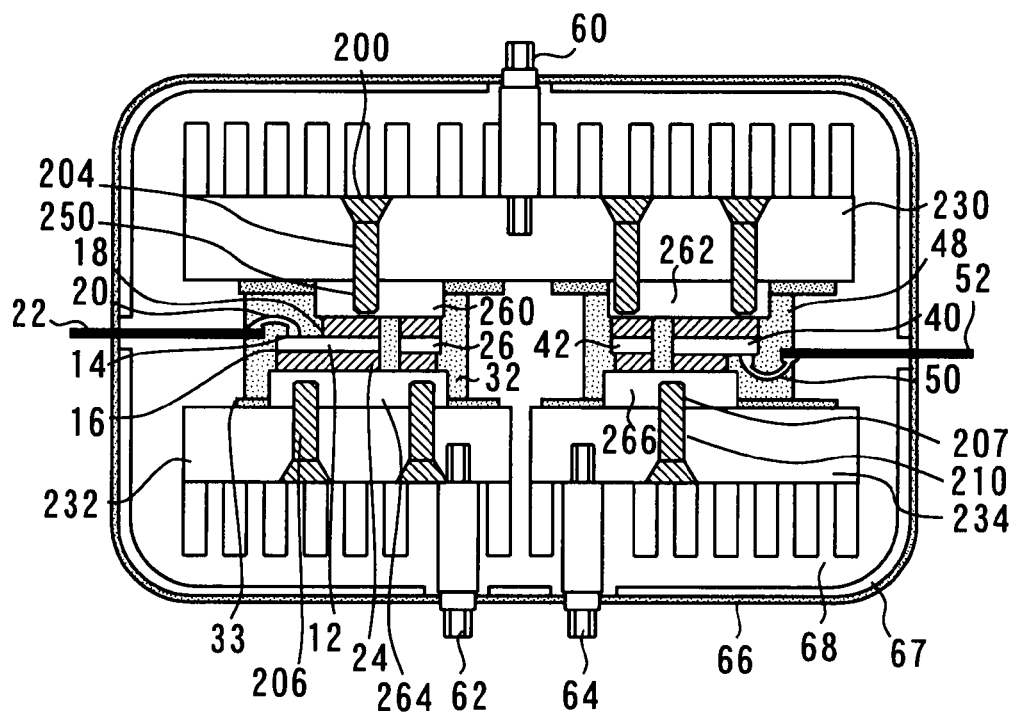
F I G. 5

POWER MODULE

BACKGROUND OF THE INVENTION

1. Field of the Invention

The present invention relates to a power module incorporating means for cooling its power devices.

2. Background Art

Power devices such as IGBTs (Insulated Gate Bipolar Transistors) and power MOSFETs have been widely used in industrial and household appliances, etc., since they are suitable for use in high voltage and high current applications. Because these power devices are used to control a large current, the electrical paths between the devices and external components preferably have low resistance. Further, since power devices generate heat, the power module is preferably constructed to have low thermal resistance to quickly dissipate the heat generated by the power devices out of the module.

Japanese Laid-Open Patent Publication No. 2007-281274 discloses a construction in which power devices are sandwiched between block-shaped upper and lower leads to reduce the electrical resistance of the power module.

Other prior art includes Japanese Laid-Open Patent Publications Nos. 2008-124430 and 2001-230582.

FIG. 7 is a diagram illustrating the construction of a typical power module. In this power module, an IGBT 602 and a diode 604 are mounted on the top surface of a ceramic 608 by solder 612, as shown in FIG. 7. The ceramic 608 serves as an insulating substrate and has a conductive pattern formed on the top surface. Wires 606 are connected between electrodes of the IGBT 602 and the diode 604 and terminals 618. The terminals 618 are mounted in a resin case 601 and used to connect the IGBT 602, etc. to an external component. On the other hand, a metal plate called a "base plate 614" is coupled to the bottom surface of the ceramic 608 by solder 610. A cover 616 is fitted in the opening of the resin case 601, thereby completing the manufacture of the power module 600.

Some of the heat generated in the power module 600 can be dissipated by radiation from its base plate 614. However, it is common that the base plate 614 is coupled to a radiating fin structure 702 with cooling grease 704 therebetween in order to sufficiently dissipate heat from and cool the power module 600, as indicated by the arrow in FIG. 7.

However, the configuration of the power module with the radiating fin structure 702 as shown in FIG. 7 does not allow for a reduction in the electrical resistance and a further improvement in the heat dissipation characteristics of the power module. Specifically, the wires 606 and the conductive pattern on the ceramic 608, which are used as electrical paths, prevent reduction of the electrical resistance of the power module. Further, the heat generated by the IGBT 602, etc. is dissipated through the path formed by the ceramic 608, the solder 610, the base plate 614, the grease 704, and the radiating fin structure 702. That is, this heat dissipation path has high thermal resistance, preventing the application of full power to the power devices such as the IGBT.

The configuration disclosed in the above Japanese Laid-Open Patent Publication No. 2007-281274 allows for a reduction in the electrical resistance of the power module, but does not have sufficient heat dissipation characteristics. Furthermore, the leads are not sufficiently insulated, since large portions of them are exposed at the resin surfaces.

SUMMARY OF THE INVENTION

The present invention has been made to solve the above problems. It is, therefore, an object of the present invention to provide a power module having reduced electrical and thermal resistance.

According to one aspect of the present invention, a power module includes a power device having a top electrode on its top surface and a bottom electrode on its bottom surface, an upper metal block having the lower surface connected to the top electrode, a lower metal block having the upper surface connected to the bottom electrode, a resin covering the power device, the upper metal block and the lower metal block so that the upper surface of the upper metal block and the lower surface of the lower metal block are exposed, an upper terminal-cooling power-applying block having a heat dissipation characteristic and electrical conductivity while being connected to the upper surface of the upper metal block, a lower terminal-cooling power-applying block having heat dissipation characteristic and electrical conductivity while being connected to the lower surface of the lower metal block, an upper terminal connected to the upper terminal-cooling power-applying block so as to connect the top electrode to an external component, a lower terminal connected to the lower terminal-cooling power-applying block so as to connect the bottom electrode to the external component, and an insulating case covering the power device, the upper metal block, the lower metal block, the resin, the upper terminal-cooling power-applying block, the lower terminal-cooling power-applying block, the upper terminal, and the lower terminal while being away from the upper terminal-cooling power-applying block and the lower terminal-cooling power-applying block by a predetermined distance so as to expose a part of the upper terminal and a part of the lower terminal.

Other and further objects, features and advantages of the invention will appear more fully from the following description.

BRIEF DESCRIPTION OF THE DRAWINGS

FIG. 1 shows the inside of the insulating case of the power module;

FIG. 2 is a cross-sectional view as viewed in the direction of the arrows II of FIG. 1;

FIG. 3 shows the power module provided with an electrical fan;

FIG. 4 is a diagram illustrating a power module of the second embodiment;

FIG. 5 shows the power module having screw holes and screw through holes;

DETAILED DESCRIPTION OF THE PREFERRED EMBODIMENTS

First Embodiment

Figure 6:
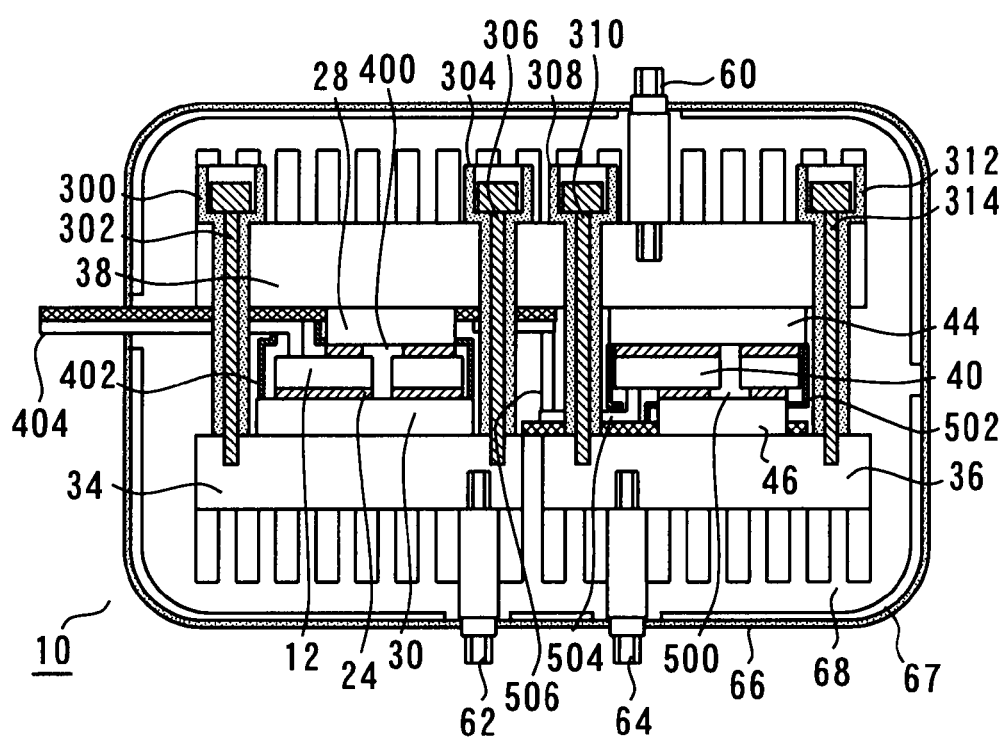
FIG. 6 illustrating a power device connected to the upper metal block by a fastening screw.

A first embodiment of the present invention will now be described with reference to FIGS. 1 to 3. It should be noted that throughout the description of the first embodiment, like numerals represent like materials or like or corresponding components, and these materials and components may be described only once. This also applies to other embodiments of the invention subsequently described.

A power module 10 of the present embodiment includes a structure including power devices and metal blocks and further includes a insulating case 66 covering the structure. FIG. 1 shows the inside of the insulating case 66 of this power module.

The power module of the present embodiment includes a first power device 12, a second power device 40, a diode 26, and a diode 42, and may be used as a U-phase, V-phase, or W-phase arm of an inverter circuit. The components disposed around the first power device 12 will first be described. The first power device 12 has an emitter electrode 18 and a gate electrode 14 on its top surface and a collector electrode 16 on its bottom surface. The top surfaces of the emitter electrode 18 and the diode 26 are connected to an upper metal block 28 by solder 24. On the other hand, the bottom surfaces of the collector electrode 16 and the diode 26 are connected to a lower metal block 30 by solder 24. The upper and lower metal blocks 28 and 30 are copper blocks. Further, the gate electrode 14 is connected to a signal terminal 22 by a wire 20.

The first power device 12, the diode 26, the upper metal block 28, and the lower metal block 30 are sealed with a resin 32 of epoxy, etc. so that the upper surface of the upper metal block 28 and the lower surface of the lower metal block 30 are exposed externally.

The upper surface of the upper metal block 28 which is not covered with the resin 32 is connected to an AC output terminal-cooling power-applying block 38 by solder 24. The AC output terminal-cooling power-applying block 38 is made of a metal such as aluminum or copper and has radiating fins. All surfaces of the AC output terminal-cooling power-applying block 38 that are not connected to the upper metal block 28 are in contact with air. An AC output terminal 60 is connected to the AC output terminal-cooling power-applying block 38 to allow an external component to be electrically connected to the upper metal block 28 connected to the emitter electrode 18.

On the other hand, the lower surface of the lower metal block 30 which is not covered with the resin 32 is connected to a P-terminal-cooling power-applying block 34 by solder 24. The P-terminal-cooling power-applying block 34 is made of a metal such as aluminum or copper and has radiating fins. All surfaces of the P-terminal-cooling power-applying block 34 that are not connected to the lower metal block 30 are in contact with air. A P-terminal 62 is connected to the P-terminal-cooling power-applying block 34 to allow an external component to be electrically connected to the lower metal block 30 connected to the collector electrode 16.

The components disposed around the second power device 40 are basically similar in configuration and arrangement to those around the first power device 12, as described below. The top surface of the collector electrode of the second power device 40 and the top surface of the diode 42 are connected to an upper metal block 44 by solder. The bottom surface of the emitter electrode of the second power device 40 and the bottom surface of the diode 42 are connected to a lower metal block 46 by solder. The second power device 40, etc. are sealed with a resin 48 so that the upper surface of the upper metal block 44 and the lower surface of the lower metal block 46 are exposed, as in the case with the first power device 12. It should be noted that the gate electrode of the second power device 40 is connected to a signal terminal 52 by a wire 50. Further, the upper surface of the upper metal block 44 is connected to an AC output terminal-cooling block 38 by solder. The lower surface of the lower metal block 46 is connected to an N-terminal-cooling power-applying block 36. The N-terminal-cooling power-applying block 36, like the P-terminal-cooling power-applying block 34, has radiating fins.

It should be noted that the components of the power module are dimensioned such that a sufficient clearance and a sufficient creepage distance are provided between the portions between which a high voltage is applied. To ensure this, an insulating material 33 is applied to or inserted into appropriate locations as necessary.

The power module 10 of the present embodiment also includes an insulating case 66. The insulating case 66 covers the first power device 12, the AC output terminal-cooling power-applying block 38, etc., and externally exposes only the signal terminals 22 and 52, the AC output terminal 60, the P-terminal 62, and the N-terminal 64. The insulating case 66 of the present embodiment is made of a material containing PPS, PBT, or PET and has a metal plate 67 on its inner walls. This metal plate 67 serves to shield the first and second power devices 12 and 40 from noise.

The insulating case 66 and the metal plate 67 are spaced from other components to form a predetermined air layer 68 in order to fulfill the following requirements. First, the insulating case 66 and the metal plate 67 should be spaced with a sufficient clearance from the AC output terminal-cooling power-applying block 38, the P-terminal-cooling power-applying block 34, and the N-terminal-cooling power-applying block 36 in order to be insulated from these power-applying blocks. Second, the insulating case 66 and the metal plate 67 should also be spaced with a sufficient clearance from the AC output terminal-cooling power-applying block 38, the P-terminal-cooling power-applying block 34, and the N-terminal-cooling power-applying block 36 in order to air cool these blocks.

FIG. 2 is a cross-sectional view as viewed in the direction of the arrows II of FIG. 1. The insulating case 66 has formed therein first vent holes 70 and second vent holes 72 which are arranged in a facing relationship, as shown in FIG. 2. These vent holes permit escape of heated air from the air layer 68 in the insulating case 66. This completes the description of the configuration of the power module of the present embodiment.

As described above, power modules are preferably constructed such that the power supply paths to the power devices have low resistance and that the modules have low thermal resistance to quickly dissipate the heat generated by the power devices out of the modules. The present embodiment provides a power module of simple construction yet having reduced electrical and thermal resistance.

The reason why the power module of the present embodiment has low electrical resistance will first be described. The emitter electrode 18 and the collector electrode 16 of the first power device 12, through which the main current passes, are connected to the upper metal block 28 and the lower metal block 30, respectively. The upper metal block 28 is connected to the AC output terminal 60 through the AC output terminal-cooling power-applying block 38, and the lower metal block 30 is connected to the P-terminal 62 through the P-terminal-cooling power-applying block 34. These main current paths have low resistance, as compared to conventional constructions in which wires and a conductive pattern on the ceramic form electrical paths. This also applies to the second power device 40.

On the other hand, the heat radiating effect of the AC output terminal-cooling power-applying block 38, the P-terminal-cooling power-applying block 34, and the N-terminal-cooling power-applying block 36 results in the power module having low thermal resistance. The power module of the present embodiment does not includes a ceramic insulating substrate, thereby reducing the thermal resistance of the power devices. Further, the heat generated by the first power device 12 is transmitted through solder and the upper metal block 28 to the AC output terminal-cooling power-applying block 38 or transmitted through solder and the lower metal block 30 to the P-terminal-cooling power-applying block 34. Likewise, the heat generated by the second power device 40 is transmitted through solder and the upper metal block 44 to the AC output terminal-cooling power-applying block 38 or transmitted through solder and the lower metal block 46 to the N-terminal-cooling power-applying block 36. This means that the heat generated by these power devices is rapidly dissipated from the power module by radiation through the radiating fins of the AC output terminal-cooling power-applying block 38, the P-terminal-cooling power-applying block 34, and the N-terminal-cooling power-applying block 36, thus reducing thermal resistance of the power module. Further, the omission of the ceramic insulating substrate results in a reduction in the manufacturing cost of the power module.

Further, in the power module 10 of the present embodiment, the air layer 68 and the insulating case 66 serve as heat insulating layers, which is desirable in terms of handling safety.

Further, in the power module of the present embodiment, the resin 32 covers the power device structure including the first power device 12, the diode 26, the upper metal block 28, and the lower metal block 30, and the resin 48 covers the power device structure including the second power device 40, the diode 42, the upper metal block 44, and the lower metal block 46. This construction reduces thermal stress occurring in the power module during its operation, resulting in increased thermal cycle and power cycle endurance. That is, the present embodiment enables the manufacture of a power module having high reliability.

Further, in the power module of the present embodiment, power is applied to the emitter and collector electrodes of the first and second power devices using the upper metal blocks 28 and 44, the lower metal blocks 40 and 46, the AC output terminal-cooling power-applying block 38, the P-terminal-cooling power-applying block 34, and the N-terminal-cooling power-applying block 36. This simplifies the wiring required to drive the power devices.

Figure 7:
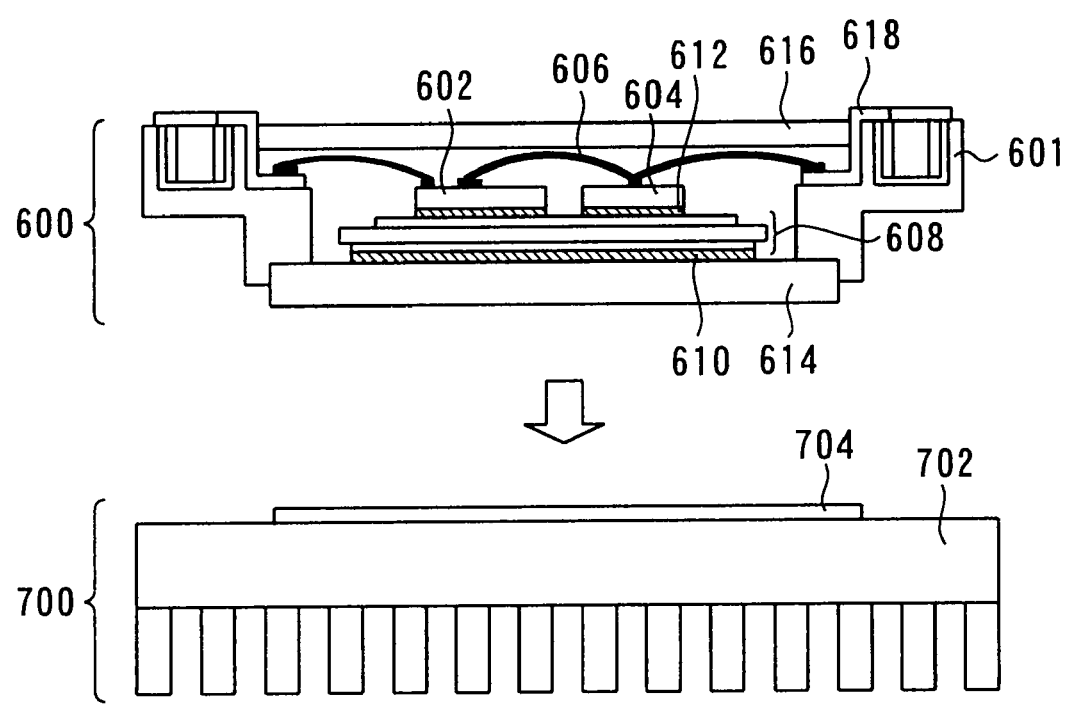
FIG. 7 is a diagram illustrating the construction of a typical power module.

Further, the power module of the present embodiment has therein the AC output terminal-cooling power-applying block 38, the P-terminal-cooling power-applying block 34, and the N-terminal-cooling power-applying block 36, all having radiating fins for cooling the power devices. This eliminates the need for the user to attach a radiating fin structure 702 as described with reference to FIG. 7.

Thus, in this power module, each power device is sandwiched between metal blocks and between cooling power-applying blocks adjacent the top and bottom electrodes of the device. These metal blocks and cooling power-applying blocks serve as power supply paths, resulting in a reduction in the electrical resistance of the power module as compared to conventional constructions in which metal plates serve as electrical paths. Furthermore, the power module of the present embodiment is characterized by including cooling power-applying blocks for applying electrical power to and radiating heat from (or cooling) the power devices. That is, the power module has a simple configuration yet has reduced thermal resistance. It should be noted that various alterations may be made to the present embodiment without departing from the scope of the present invention. Examples of such variations will now be described.

Although as described with reference to FIG. 2 the power module of the present embodiment includes the first and second vent holes 70 and 72 to allow escape of heated air from the air layer 68, it is to be understood that the invention is not limited to this particular construction. For example, the power module may be provided with an electrical fan 80 having fins 82 which is in contact with the vent holes, as shown in FIG. 3, to more effectively cool the power devices.

Although in the present embodiment the AC output terminal-cooling power-applying block 38, the P-terminal-cooling power-applying block 34, and the N-terminal-cooling power-applying block 36 are provided with radiating fins to effectively cool the power devices, it is to be understood that the invention is not limited to this particular cooling construction. For example, instead of using air as a cooling medium, the power devices may be cooled by an insulating liquid medium which does not affect the electrical characteristics of the devices.

Although in the present embodiment the insulating case 66 is provided with the metal plate 67 on its inner walls, it is to be understood that the invention is not limited to this particular structure. For example, in addition to the metal plate 67 being disposed on the inner walls of the insulating case 66, another insulating case may be disposed on the inner walls of the metal plate 67, thus forming a three layer structure. Further, if it is not necessary to shield the first and second power devices 12 and 40 from noise, then only the insulating case 66 may be employed.

Further, the upper metal blocks 28 and 44, the lower metal blocks 30 and 46, the AC output terminal-cooling power-applying block 38, the P-terminal-cooling power-applying block 34, and the N-terminal-cooling power-applying block 36 may be made of any suitable material having high electrical conductivity and low thermal resistance. Further, the power devices in the power module may be of any type which generates heat.

Second Embodiment

A second embodiment of the present invention will now be described with reference to FIGS. 4 to 6. FIG. 4 is a diagram illustrating a power module of the present embodiment. This power module is basically similar in configuration to that of the first embodiment, and only the differences from the first embodiment will be described.

The AC output terminal-cooling power-applying block 110 in the power module of the present embodiment includes two spaced apart screw through-holes 101. Further, the P-terminal-cooling power-applying block 110 and the N-terminal-cooling power-applying block 112 in the power module each have formed therein a screw hole 103 aligned with a respective one of the screw through-holes 101.

A fastening screw 102 is passed through one of the screw through-holes 101 and screwed into the screw hole 103 in the P-terminal-cooling power-applying block 112 so that the resin 32 encapsulating the first power device 12 is pinched between the AC output terminal-cooling power-applying block 110 and the P-terminal-cooling power-applying block 112 in contact with the upper surface of the upper metal block 28 and the lower surface of the lower metal block 30, respectively, with a predetermined pressure. It should be noted that the fastening screw 102 is covered with an insulating socket 100 to prevent electrical connection between the AC output terminal-cooling power-applying block 110 and the P-terminal-cooling power-applying block 112. Further, another fastening screw 102 is passed through the other one of the screw through-holes 101 and screwed into the screw hole 103 in the N-terminal-cooling power-applying block 114 so that the resin 48 encapsulating the second power device 40 is pinched between the AC output terminal-cooling power-applying block 110 and the N-terminal-cooling power-applying block 114 with a predetermined pressure.

Thus, the resins 32 and 48 encapsulating the first and second power devices 12 and 40, respectively, are pinched between the AC output terminal-cooling power-applying block 110 and the P-terminal-cooling power-applying block 112 and between the AC terminal-cooling power-applying block 110 and the N-terminal-cooling power-applying block 114, respectively, using the fastening screws 102 such that the upper surfaces of the upper metal blocks 28 and 44 are coupled to the AC output terminal-cooling power-applying block 110 and such that the lower surfaces of the lower metal blocks 30 and 46 are coupled to the P-terminal-cooling power-applying block 112 and the N-terminal-cooling power-applying block 114, respectively. This arrangement eliminates the need for soldering between the AC terminal-cooling power-applying block 110 and the upper surfaces of the upper metal blocks 28 and 44, between the P-terminal-cooling power-applying block 112 and the lower surface of the lower metal block 30, and between the N-terminal-cooling power-applying block 114 and the lower surface of the lower metal block 46.

Thus according to the present embodiment, components (i.e., the blocks described above) are connected together using fastening screws. This makes it easy to replace the two power device structures respectively sealed with the resin 32 and the resin 48, thus facilitating material recycling. For example, only a power device structure in the power module may be removed and replaced, and the metal blocks in the peripheral portions of the removed power device structure may be reused.

Thus, there are various power module constructions that allow a portion or portions of the module to be detached, as disclosed, e.g., in FIGS. 5 and 6.

In the power module shown in FIG. 5, upper metal blocks 260 and 262 have screw holes 250 therein and an AC output terminal-cooling power-applying block 230 has screw through-holes 204 each aligned with a respective one of the screw holes 250. Fastening screws 200 are passed through the screw through-holes 204 and screwed into the screw holes 250 to connect the upper metal blocks 260 and 262 to the AC output terminal-cooling power-applying block 230.

Likewise, lower metal blocks 264 and 266 have screw holes 207 therein, and a P-terminal-cooling power-applying block 232 and an N-terminal-cooling power-applying block 234 have screw through-holes 210 each aligned with a respective one of the screw holes 207. Fastening screws 206 are passed through the screw through-holes 210 and screwed into the screw holes 207 to connect the lower metal blocks 264 and 266 to the P-terminal-cooling power-applying block 232 and the N-terminal-cooling power-applying block 234, respectively.

The construction shown in FIG. 5 has the same advantages as the construction shown in FIG. 4. Furthermore, unlike the construction of FIG. 4, this construction does not include insulating sockets.

In the power module shown in FIG. 6, the first power device 12 is connected to the upper metal block 28 by a fastening screw 400, and the second power device 40 is connected to the lower metal block 46 by a fastening screw 500. In this power module, the first and second power devices 12 and 40, etc. are not sealed with a resin, but instead these power devices are insulated using holders 402 and 502 and a coating 520 of an insulating material. The first and second power devices 12 and 14 are connected to upper and lower metal blocks. Further, a signal terminal 404 is connected to the first power device 12, and a signal terminal 504 is connected to the second power device 40. The signal terminal 404 extends out of the power module, and the signal terminal 504 is connected to a bar terminal 506 which extends out of the power module.

In the present embodiment, the P-terminal-cooling block 112 and the N-terminal-cooling block 114 each have a screw hole 103 formed therein and the AC output terminal-cooling power-applying block 110 has screw through-holes 101 formed therein, as shown in FIG. 4. It is to be understood, however, that in other embodiments the P-terminal-cooling block 112 and the N-terminal-cooling block 114 may have a screw through-hole and the AC output terminal-cooling power apply block 110 may have screw holes instead. Further, the number of fastening screws is arbitrary as long as full coupling is accomplished.

Solder material or indium foil may be interposed between the AC output terminal-cooling power-applying block 110 and the upper metal blocks 28 and 44 to stabilize the thermal and electrical connection therebetween. The use of solder material and indium foil does not reduce the disassemblability of the power module. The discussion above also applies to other coupling portions using fastening screws.

The power devices of the first and second embodiments may be formed on an SiC substrate, which enables the manufacture of high voltage, high current power modules.

Thus the present invention enables the manufacture of a power module having reduced electrical and thermal resistance.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-069392, filed on Mar. 23, 2009 including specification, claims, drawings and summary, on which the Convention priority of the present application is based, are incorporated herein by reference in its entirety.

What is claimed is:

1. A power module comprising:
 a power device having a top electrode on its top surface and a bottom electrode on its bottom surface;
 an upper metal block having the lower surface connected to the top electrode;
 a lower metal block having the upper surface connected to the bottom electrode;
 a resin covering the power device, the upper metal block and the lower metal block so that the upper surface of the upper metal block and the lower surface of the lower metal block are exposed;
 an upper terminal-cooling power-applying block having a heat dissipation characteristic and electrical conductivity while being connected to the upper surface of the upper metal block;
 a lower terminal-cooling power-applying block having heat dissipation characteristic and electrical conductivity while being connected to the lower surface of the lower metal block;
 an upper terminal connected to the upper terminal-cooling power-applying block so as to connect the top electrode to an external component;

a lower terminal connected to the lower terminal-cooling power-applying block so as to connect the bottom electrode to the external component; and an insulating case covering the power device, the upper metal block, the lower metal block, the resin, the upper terminal-cooling power-applying block, the lower terminal-cooling power-applying block, the upper terminal, and the lower terminal while being away from the upper terminal-cooling power-applying block and the lower terminal-cooling power-applying block by a predetermined distance so as to expose a part of the upper terminal and a part of the lower terminal.

2. The power module as claimed in claim 1, wherein both of the upper terminal-cooling power-applying block and the lower terminal-cooling power-applying block have a radiating fin, respectively.

3. The power module as claimed in claim 1, wherein the insulating case is provided with a vent hole.

4. The power module as claimed in claim 3, further comprising a electrical fan provided on the outer wall of the insulating case so as to exhaust the air in the insulating case to out of the insulating case through the vent hole.

5. The power module as claimed in claim 1, wherein
one of the upper terminal-cooling power-applying block and the lower terminal-cooling power-applying block is provided with a screw hole;
the other of the upper terminal-cooling power-applying block and the lower terminal-cooling power-applying block is provided with a screw through-hole aligned with the screw hole;
the power module further comprising a fastening screw passed through the screw through-hole and screwed into the screw hole so that the top electrode and the bottom electrode are pinched between the upper terminal-cooling power-applying block and the lower terminal-cooling power-applying block;
wherein the fastening screw is screwed such that the upper surface of the upper metal block is in contact with the upper terminal-cooling power-applying block directly or via a metal foil, and the lower surface of the lower metal block is in contact with the lower terminal-cooling power-applying block directly or via a metal foil.

6. The power module as claimed in claim 1, wherein
the upper terminal-cooling power-applying block is provided with a first screw through-hole;
the upper metal block is provided with a first screw hole aligned with the first screw through-hole on its upper surface;
the lower terminal-cooling power-applying block is provided with a second screw through-hole;
the lower metal block is provided with a second screw hole aligned with the second screw through-hole on its lower surface;
the power module further comprising:
a first fastening screw passed through the first screw through-hole and screwed into the first screw hole such that the upper surface of the upper metal block is in contact with the upper terminal-cooling power-applying block directly or via a metal foil; and
a second fastening screw passed through the second screw through-hole and screwed into the second screw hole such that the lower surface of the lower metal block is in contact with the lower terminal-cooling power-applying block directly or via a metal foil.

7. The power module as claimed in claim 1, wherein
either of a screw tightening between the top electrode and the lower surface of the upper metal block or a screw tightening between the bottom electrode and the upper surface of the lower metal block is implemented by either of a screw tightening between the power device and the upper metal block or a screw tightening between the power device and the lower metal block.

8. The power module as claimed in claim 1, further comprising a metal plate formed on an inner surface of the insulating case while being away from the upper terminal-cooling power-applying block and the lower terminal-cooling power-applying block by the predetermined distance.

9. The power module as claimed in claim 1, wherein at least a part of the power device is formed on a SiC substrate.

* * * * *